(12) United States Patent
Akiyama

(10) Patent No.: US 8,716,106 B2
(45) Date of Patent: May 6, 2014

(54) METHOD FOR PRODUCING A BONDED SUBSTRATE

(75) Inventor: Shoji Akiyama, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 12/744,567

(22) PCT Filed: Nov. 27, 2008

(86) PCT No.: PCT/JP2008/071573
§ 371 (c)(1),
(2), (4) Date: Jul. 14, 2010

(87) PCT Pub. No.: WO2009/069709
PCT Pub. Date: Jun. 4, 2009

(65) Prior Publication Data
US 2010/0301455 A1    Dec. 2, 2010

(30) Foreign Application Priority Data

Nov. 27, 2007   (JP) .................................. 2007-306406

(51) Int. Cl.
*H01L 21/30* (2006.01)

(52) U.S. Cl.
USPC ................... 438/458; 257/616; 257/E21.568; 257/E29.068

(58) Field of Classification Search
USPC ............ 257/616, E21.568, E29.068; 438/458
See application file for complete search history.

(56) References Cited

U.S. PATENT DOCUMENTS 5,338,942 A    8/1994  Nishida et al.

(Continued)

FOREIGN PATENT DOCUMENTS

EP    1 855 309  A1    11/2007

(Continued)

OTHER PUBLICATIONS

International Search Report of International Application No. PCT/JP2008/071573 Dated Mar. 3, 2009.
Roosevelt People, Physics and Applications of GexSi1-x/Si Strained-Layer Heterostructures, IEEE Journal of Quantum Electronics, Sep. 1986, pp. 1696-1710, vol. QE-22, No. 9.

(Continued)

*Primary Examiner* — Marvin Payen

(74) *Attorney, Agent, or Firm* — Roberts Mlotkowski Safran & Cole, P.C.; David S. Safran

(57) ABSTRACT

A method for producing a bonded substrate having a $Si_{1-x}Ge_x$ ($0<x\leq1$) film in which a larger than ever biaxial strain has been introduced. Specifically, the method involves at least the steps of: providing a donor wafer and a handle wafer having a thermal expansion coefficient lower than the donor wafer, implanting ions of any one or both of hydrogen and a noble gas into the donor wafer to form an ion-implanted layer, performing a plasma activation treatment on at least one of bonding surfaces of the donor wafer and the handle wafer, bonding the donor wafer to the handle wafer, splitting the donor wafer through application of a mechanical impact to the ion-implanted layer, performing a surface treatment on a split surface of the donor wafer, and epitaxially growing a $Si_{1-x}Ge_x$ ($0<x\leq1$) film on the split surface to thus form a strained $Si_{1-x}Ge_x$ ($0<x\leq1$) film on the bonded wafers.

10 Claims, 1 Drawing Sheet

(56) References Cited

U.S. PATENT DOCUMENTS

| | | | |
|---|---|---|---|
| 2002/0167048 A1 | 11/2002 | Tweet et al. | |
| 2004/0058482 A1 | 3/2004 | Yoshida et al. | |
| 2006/0014363 A1* | 1/2006 | Daval et al. | 438/455 |
| 2007/0218647 A1* | 9/2007 | Chu et al. | 438/455 |
| 2007/0259526 A1 | 11/2007 | Kang et al. | |
| 2008/0315349 A1* | 12/2008 | Takei et al. | 257/506 |
| 2010/0025804 A1 | 2/2010 | Kawai et al. | |

FOREIGN PATENT DOCUMENTS

| | | |
|---|---|---|
| JP | 06-236975 A | 8/1994 |
| JP | 2000-277715 A | 10/2000 |
| JP | 2006-324530 A | 11/2006 |
| WO | 2006/092886 A1 | 9/2006 |

OTHER PUBLICATIONS

Douglas D. Cannon, et al., Tensile Strained Spitaxial Ge Films on Si(100) Substrates With Potential Application in L-Band Telecommunications, Applies Physics Letters, Feb. 9, 2004, pp. 906-908, vol. 84, No. 6, American Institute of Physics.

Yasuhiko Ishikawa et al., Strain-Induced Band Gap Shrinkage in Ge Grown on Si Substrate, Applied Physics Letters, Mar. 31, 2003, pp. 2044-2046, vol. 82, No. 13, American Institute of Physics.

European Search Report for Corresponding Application No. EP 08 85 3796, Dated Jul. 12, 2011.

Japanese Offical Action, Corresponding to Japanese Application No. 2007-306406, Mailed Oct. 9, 2012, English Translation.

Japanese Inquiry, Corresponding to Japanese Application No. 2007-306406, Mailed Sep. 10, 2013, English Translation.

* cited by examiner

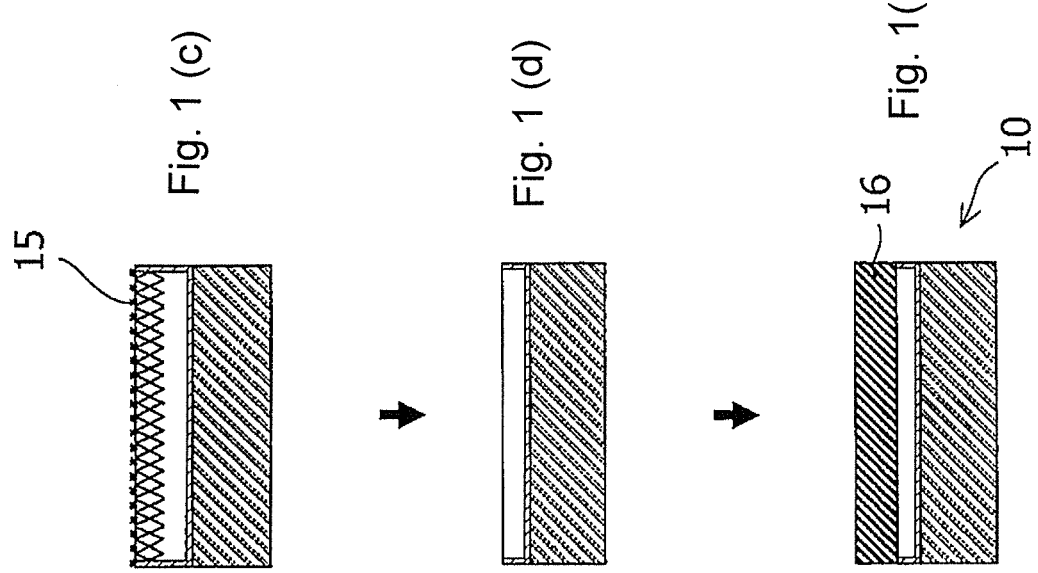
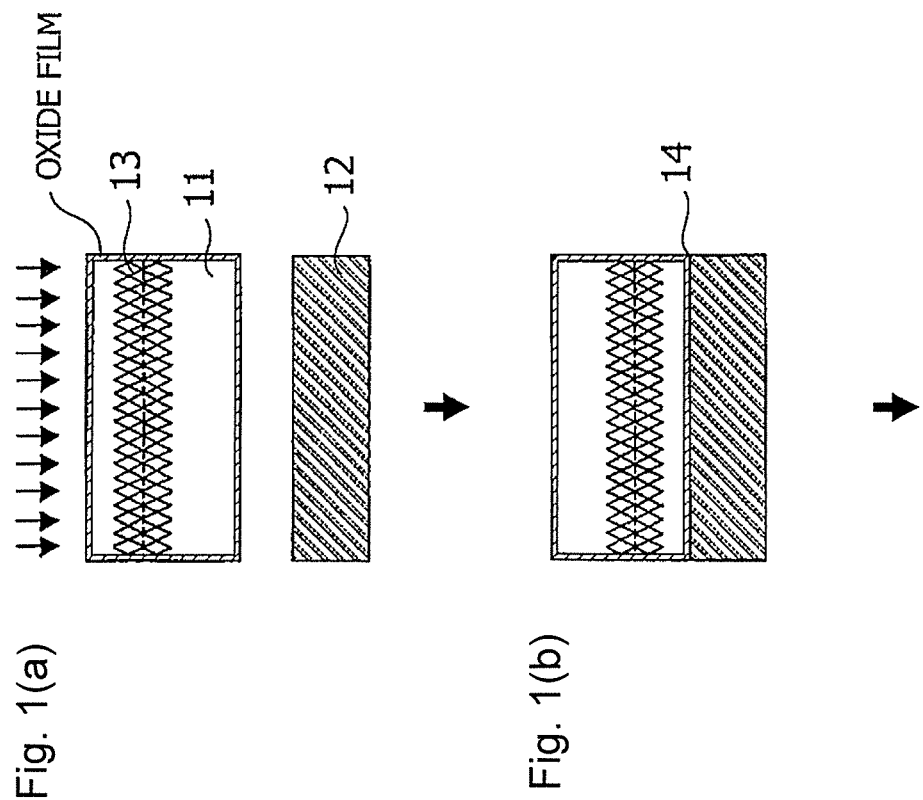

METHOD FOR PRODUCING A BONDED SUBSTRATE

BACKGROUND OF THE INVENTION

1. Field of the Invention

The present invention relates to a method for producing a bonded substrate. Particularly, the present invention relates to a method for producing a bonded substrate comprising a $Si_{1-x}Ge_x$ (wherein x is a number satisfying $0<x\leq1$) film in which a biaxial strain has been introduced.

2. Description of Related Art

A strained silicon substrate in which a strain is induced in a silicon layer has been proposed in addition to a conventional bulk silicon wafer and silicon-on-insulator (SOI). The strained silicon substrate is one of means for increasing the carrier mobility in a semiconductor device.

In a typical method for producing the strained silicon substrate, a SiGe layer containing 15% to 20% germanium (molar concentration) is epitaxially grown on a silicon wafer, and silicon is epitaxially grown on the SiGe layer to obtain a strained silicon layer (see, for example, R. People, "Physics and applications of GexSi1-x/Si strained layer structures," IEEE Journal of Quantum Electronics, QE-22, 1696 (1986)). The method is characterized in that, since the lattice constant of the SiGe layer is larger than the lattice constant of the silicon layer, a biaxial strain is laterally introduced in the silicon layer epitaxially grown on the SiGe layer. Accordingly, the mobility of electrons is increased.

There is also a report that, by inducing a biaxial strain in a Ge film, the absorption coefficient at 1.55 μm in a wavelength band for optical communications is increased (see, for example, D. D. Cannon, J. F. Liu, Y. Ishikawa, K. Wada, D. T. Danielson, S. Jongthammanurak, J. Michel and L. C. Kimerling: Appl. Phys. Lett. 84, 906 (2004) and Y. Ishikawa, K. Wada, D. D. Cannon, J. F. Liu, H. C. Luan, and L. C. Kimerling: Appl. Phys. Lett. 82, 2044 (2003)).

In this method, Ge is directly epitaxially grown on a silicon wafer at 500° C. to 800° C. In the cooling process, a biaxial strain is introduced in the Ge film due to the difference in expansion coefficient between Si and Ge (the expansion coefficient of Si is $2.6\times10^{-6}$/K, while the expansion coefficient of Ge is $5.9\times10^{-6}$/K).

The strained Ge film is possibly used as a light receiving element or the like in, for example, an optical integrated circuit in the future, which can be regarded as one of the important applications thereof.

SUMMARY OF THE INVENTION

The present invention provides a method for producing a bonded substrate, the method being able to easily produce a bonded substrate comprising a SiGe film or Ge film (hereinafter, may also be referred to as a $Si_{1-x}Ge_x$ film (wherein x is a number satisfying $0<x\leq1$)) in which a larger biaxial strain has been introduced than ever.

In order to solve the above problem, the present invention provides a method for producing a bonded substrate, comprising at least the steps of: providing a donor wafer and a handle wafer having a thermal expansion coefficient lower than the donor wafer, implanting ions of any one or both of hydrogen and a noble gas into the donor wafer to form an ion-implanted layer, performing a surface activation treatment on at least one of bonding surfaces of the donor wafer and the handle wafer, bonding the donor wafer to the handle wafer, thinning the donor wafer by splitting the donor wafer through application of a mechanical impact to the ion-implanted layer of the donor wafer, performing a surface treatment on a split surface of the thinned donor wafer, and epitaxially growing a $Si_{1-x}Ge_x$ ($0<x\leq1$) film on the split surface to form a strained $Si_{1-x}Ge_x$ ($0<x\leq1$) film on the bonded wafers.

As described above, the production method of the present invention are characterized in that: the ion-implanted donor wafer is bonded to the handle wafer having a thermal expansion coefficient lower than the donor wafer, the surface activation treatment is performed to increase the bonding strength and then the wafers are bonded together, the donor wafer is thinned by splitting the donor wafer along the ion-implanted layer through the application of a mechanical impact, the surface treatment is performed on the split surface of the thinned donor wafer, and thereafter the $Si_{1-x}Ge_x$ ($0<x\leq1$) film is epitaxially grown on the split surface.

Here, when the $Si_{1-x}Ge_x$ ($0<x\leq1$) film is epitaxially grown, the bonded wafers are heated. During the epitaxial growth, the donor wafer tries to expand more than the handle wafer because the donor wafer has a thermal expansion coefficient higher than the handle wafer. However, since the strength of bonding between the donor and handle wafers is sufficiently high, the donor wafer is not allowed to expand in such a manner that the donor wafer is pulled by the handle wafer. Moreover, the biaxial strain in the $Si_{1-x}Ge_x$ ($0<x\leq1$) film formed on the donor wafer is relaxed at the temperature during the epitaxial growth, and the $Si_{1-x}Ge_x$ ($0<x\leq1$) film tries to contract when cooled after the epitaxial growth. However, since the handle wafer has a thermal expansion coefficient lower than the donor wafer, the handle wafer hardly contracts. The sufficiently high bonding strength as described above does not allow the $Si_{1-x}Ge_x$ ($0<x\leq1$) film to contract in such a way that the $Si_{1-x}Ge_x$ ($0<x\leq1$) film follows the manner of the handle wafer. In this way, a large biaxial strain is introduced in the epitaxially grown $Si_{1-x}Ge_x$ ($0<x\leq1$) film. Hence, it is possible to obtain a bonded substrate comprising a $Si_{1-x}Ge_x$ ($0<x\leq1$) film in which a large biaxial strain has been introduced.

Furthermore, the strained $Si_{1-x}Ge_x$ ($0<x\leq1$) film can be formed on a newly provided silicon substrate or a newly provided silicon substrate with an oxide film thereon as follows. Specifically, a bonded substrate produced by the above method is bonded to the newly provided silicon substrate or the newly provided silicon substrate with an oxide film thereon. Then, the strained $Si_{1-x}Ge_x$ ($0<x\leq1$) film is transferred to the newly provided silicon substrate or newly provided silicon substrate with an oxide film thereon.

In this manner, it is possible to obtain a bonded substrate comprising a strained $Si_{1-x}Ge_x$ ($0<x\leq1$) film on a silicon substrate, the strained $Si_{1-x}Ge_x$ ($0<x\leq1$) film having a large biaxial strain introduced therein.

As described above, according to the method for producing a bonded substrate of the present invention, a large biaxial strain can be introduced in a $Si_{1-x}Ge_x$ ($0<x\leq1$) film more easily in comparison with a conventional method. This makes it possible to produce a bonded substrate comprising the $Si_{1-x}Ge_x$ ($0<x\leq1$) film in which the large biaxial strain has been introduced.

BRIEF DESCRIPTION OF THE DRAWINGS

FIGS. 1(a)-1(e) show illustrate one example of steps in a method for producing a bonded substrate of the present invention.

DETAILED DESCRIPTION OF THE INVENTION

Hereinafter, the present invention will be described more specifically.

The present inventors have earnestly studied a method for producing a bonded substrate in which a larger biaxial strain has been efficiently introduced in comparison with a conventional strained $Si_{1-x}Ge_x$ ($0<x\leq1$) film.

As a result, the present inventors have found the following fact and achieved the completion of the present invention. Specifically, a large biaxial strain is introduced in a $Si_{1-x}Ge_x$ ($0<x\leq1$) film epitaxially grown on a donor wafer after the donor wafer is bonded to a handle wafer made of a material having a thermal expansion coefficient lower than the donor wafer.

Although the bonded substrate of the present invention will be described below, the present invention is not limited thereto.

In one of preferred embodiments of the present invention, the bonded substrate comprises at least a quartz substrate, a silicon film and a $Si_{1-x}Ge_x$ ($0<x\leq1$) film. The silicon film is a film thinned by splitting after the quartz substrate is bonded thereto. The strained $Si_{1-x}Ge_x$ ($0<x\leq1$) film is epitaxially grown on the silicon film.

Such a bonded substrate is obtained by the method for producing a bonded substrate in the present invention described below, using the quartz substrate as the handle wafer and using a silicon substrate as the donor wafer.

Hereinafter, the method for producing a bonded substrate of the present invention will be described with reference to FIG. 1. However, the present invention is not limited thereto.

FIGS. 1(a)-1(e) show one example of steps in the method for producing a bonded substrate of the present invention.
(Step a: Providing Dono r and Handle Wafers, Implanting Ions into Donor Wafer)

First, as shown in FIG. 1(a), a donor wafer 11 and a handle wafer 12 made of a material having a thermal expansion coefficient lower than the donor wafer are provided.

Next, ions of any one or both of hydrogen and a noble gas are implanted into one surface of the donor wafer 11 to form an ion-implanted layer 13.

Here, a silicon substrate or a silicon substrate with an oxide film thereon can preferably be used as the donor wafer 11.

The preferable thickness of the donor wafer is not particularly limited, but is desirably approximate to the thickness of a silicon wafer standardized by SEMI or the like. This is because semiconductor devices are often designed to use a wafer of this thickness. From this viewpoint, the thickness is preferably 300 to 900 μm. The silicon oxide film of the silicon substrate with an oxide film thereon preferably has a thickness of 50 to 500 nm. The silicon oxide film can be formed by a generally-accepted thermal oxidation method. However, if the silicon oxide film is too thin, it is difficult to control the thickness of the oxide film. If the thickness is too thick, it takes a longer time to form such a silicon oxide film. By implanting hydrogen ions through the silicon oxide film, an effect of suppressing channeling of the implanted ions is obtained.

When the silicon substrate or the silicon substrate with an oxide film thereon as described above is used as the donor wafer, a $Si_{1-x}Ge_x$ ($0<x\leq1$) film can be epitaxially grown on the surface of silicon having a lattice constant smaller than $Si_{1-x}Ge_x$ ($0<x\leq1$). Accordingly, a larger biaxial strain can be easily introduced in the $Si_{1-x}Ge_x$ ($0<x\leq1$) film during the substrate cooling after the epitaxial growth.

Meanwhile, a quartz substrate can preferably be used as the handle wafer 12.

When quartz having a thermal expansion coefficient ($5\times10^{-7}$/K) lower than silicon and germanium have is used as the handle wafer in this manner, a larger biaxial strain can be introduced in the $Si_{1-x}Ge_x$ ($0<x\leq1$) film. Moreover, quartz has an advantage that impurities are hardly introduced in the $Si_{1-x}Ge_x$ layer.

Moreover, a material having a thermal expansion coefficient of $1.3\times10^{-6}$ (/K) or lower can preferably be used as the handle wafer 12. Thermal expansion coefficient can be measured based on Japanese Industrial Standards (JIS) R 1618.

When the material having a thermal expansion coefficient of $1.3\times10^{-6}$ (/K) or lower as described above is provided as the handle wafer, a larger biaxial strain can be introduced into the $Si_{1-x}Ge_x$ ($0<x\leq1$) film.

In the method for forming the ion-implanted layer 13 in the donor wafer 11 by implanting the ions of any one or both of hydrogen and a noble gas, the implantation energy, implantation dose, implantation temperature and other ion implantation conditions can also be appropriately selected so as to obtain the film having a predetermined thickness. As the specific examples, the temperature of the substrate during the implantation may be 250° C. to 400° C., the ion implantation depth may be 0.5 μm, the implantation energy may be 20 to 100 keV, and the implantation dose may be $1\times10^{16}$ to $1\times10^{17}$/cm². However, the ion implantation conditions are not limited thereto.

(Step b: Performing Surface Activation Treatment, Bonding Wafers)

Next, as shown in FIG. 1(b), the bonding surfaces of at least one of the donor wafer 11 and the handle wafer 12 is subjected to, for example, a plasma activation treatment or an ozone treatment as a surface activation treatment.

Then, the bonding surface of the donor wafer 11 is closely adhered to the bonding surface of the handle wafer 12 for bonding In this event, since at least one of the bonding surfaces of the donor wafer 11 and the handle wafer 12 has been subjected to the surface activation treatment, the bonding strength at a bonded surface 14 therebetween is sufficiently high.

Here, a plasma treatment can be performed as the surface activation treatment. When the plasma treatment is performed as the surface activation treatment in the above manner, the surface of the substrate subjected to the surface activation treatment is activated, for example, in a way that the number of OH groups on the surface is increased. Accordingly, when the handle wafer 12 is closely adhered to the ion-implanted surface of the donor wafer 11 in this state, the wafers can be strongly bonded together with a hydrogen bond and so forth. Alternatively, an ozone treatment or the like can be performed as the surface activation treatment, or several types of treatments may be performed in combination.

The plasma treatment is preferably performed as follows. Specifically, a substrate cleaned by RCA cleaning or the like is placed in a vacuum chamber. After a plasma gas is introduced therein, the substrate is exposed to a high-frequency plasma of preferably approximately 100 W for approximately 5 to 30 seconds. Thus, the surface of the substrate is subjected to the plasma treatment. The plasma gas can include an oxygen gas plasma for treating a silicon substrate with an oxide film thereon; and a hydrogen gas, an argon gas, a mixed gas of a hydrogen gas and an argon gas, or a mixed gas of a hydrogen gas and a helium gas for treating a silicon substrate. Meanwhile, a nitrogen gas that is an inert gas may be used.

The ozone treatment is preferably performed as follows. Specifically, a substrate cleaned by RCA cleaning or the like is placed in a chamber in which an air has been introduced. After a plasma gas such as a nitrogen gas or an argon gas is introduced therein, a high-frequency plasma is generated to convert oxygen in the air into ozone. Thus, the surface of the substrate is subjected to the ozone treatment.

The substrates can be strongly bonded together without high temperature treatment when the surface subjected to the surface activation treatment as described above is used as the bonding surface and the substrates are closely adhered together, for example, under a reduced pressure or normal pressure at room temperature.

Here, after the step of bonding the donor wafer to the handle wafer, but before a step of thinning the donor wafer, a heat treatment in a temperature range of 100° C. to 350° C. can be preferably performed on the bonded wafers.

When the heat treatment in the temperature range of 100° C. to 350° C. is performed on the bonded wafers, a higher strength of bonding between the donor wafer and the handle wafer can be achieved. Moreover, this can further reduce the possibility that a bonding defect occurs between the bonded wafers in the subsequent steps, such as a step of splitting and a step of epitaxially growing the $Si_{1-x}Ge_x$ ($0<x\leq1$) film.

(Step c: Splitting)

Next, as shown in FIG. 1(c), the donor wafer 11 is thinned by splitting the donor wafer 11 along the ion-implanted layer 13 preferably through application of a mechanical impact to the ion-implanted layer 13. The thickness of the thinned donor wafer is preferably 300 to 500 nm, and further preferably approximately 400 nm, although depending on the depth to the ion-implanted layer from the wafer surface from which the ions are implanted. Moreover, the thickness of the ion-implanted layer is favorably a thickness which easily allows the splitting by the mechanical impact. The thickness is preferably 200 to 400 nm, and further, preferably approximately 300 nm.

(Step d: Performing Surface Treatment)

Next, as shown in FIG. 1(d), a surface treatment is performed on a split surface 15 of the thinned donor wafer. Thereby, an ion-implanted damaged layer remained in the split surface 15 is removed.

Here, at least one treatment of a polishing treatment, a heat treatment and an etching treatment can preferably be performed as the surface treatment.

When at least one treatment of the polishing treatment, the heat treatment and the etching treatment is performed as the surface treatment, the ion-implanted damaged layer which is present in the split surface of the donor wafer can be surely removed. Thus, in the subsequent step, a $Si_{1-x}Ge_x$ ($0<x\leq1$) film with a higher crystallinity can be epitaxially grown. The crystallinity of the $Si_{1-x}Ge_x$ ($0<x\leq1$) film can be further improved in the subsequent step.

(Step e: Epitaxial Growing $Si_{1-x}Ge_x$ ($0<x\leq1$) Film)

Next, as shown in FIG. 1(e), a $Si_{1-x}Ge_x$ ($0<x\leq1$) film is epitaxially grown on the split surface of the donor wafer 11 which the surface has been subjected to the surface treatment after thinning. Thus, a strained $Si_{1-x}Ge_x$ ($0<x\leq1$) film 16 is formed to produce a bonded substrate 10. Although the preferable thickness of the strained $Si_{1-x}Ge_x$ ($0<x\leq1$) film is variable depending on the size of the strain, it is preferably 50 to 500 nm.

As the epitaxial growth method for the growth of the $Si_{1-x}Ge_x$ ($0<x\leq1$) film, a chemical vapor deposition method such as LPCVD (Low Pressure Chemical Vapor Deposition) and UHVCVD (Ultra High Vacuum CVD) can be employed.

For example, by using the LPCVD method, $Si_{1-x}Ge_x$ ($0<x\leq1$) is grown on the split surface of the donor wafer which the surface has been subjected to the surface treatment. In this epitaxial growth, for example, a mixed gas of $SiH_4$ or $SiH_2Cl_2$ and $GeH_4$ can preferably be used as a raw-material gas, $H_2$ can preferably be used as a carrier gas, and $10^{-5}$ to $10^{-7}$ Torr can preferably be used as the pressure condition.

Here, in the step of epitaxially growing the $Si_{1-x}Ge_x$ ($0<x\leq1$) film, the epitaxial growth temperature can preferably be 500° C. or higher.

When the epitaxial growth temperature is 500° C. or higher, the amount of biaxial strain introduced during cooling after the epitaxial growth of the $Si_{1-x}Ge_x$ ($0<x\leq1$) film can be further increased. Although the upper limit of the epitaxial growth temperature is variable depending on the composition, it is preferably the melting point of Ge (926° C.), more preferably approximately 900° C.

Moreover, in the strained $Si_{1-x}Ge_x$ ($0<x\leq1$) film, x can preferably be made 0.1 or greater.

If the proportion of germanium in the strained $Si_{1-x}Ge_x$ ($0<x\leq1$) film is increased by keeping $x\geq0.1$, the size of the biaxial strain induced in the $Si_{1-x}Ge_x$ film can be further increased, for example, when a silicon substrate is used as the donor wafer.

According to the method for producing a bonded substrate of the present invention as described above, the biaxial strain in the $Si_{1-x}Ge_x$ ($0<x\leq1$) film formed on the donor wafer is relaxed at the temperature during the epitaxial growth. The $Si_{1-x}Ge_x$ ($0<x\leq1$) film tries to contract when cooled after the epitaxial growth. In contrast, the handle wafer hardly contracts because the handle wafer has a thermal expansion coefficient lower than the donor wafer has. Since the bonding strength is sufficiently high, the $Si_{1-x}Ge_x$ ($0<x\leq1$) film is not allowed to contract in such a way that the $Si_{1-x}Ge_x$ ($0<x\leq1$) film follows the manner of the handle wafer. Consequently, a large biaxial strain is introduced in the $Si_{1-x}Ge_x$ ($0<x\leq1$) film. Hence, a bonded substrate comprising the $Si_{1-x}Ge_x$ ($0<x\leq1$) film in which such a larger biaxial strain has been introduced can be produced.

Moreover, one of preferred embodiments of the present invention provides a bonded substrate comprising at least a quartz substrate, a silicon film on the quartz substrate, and a strained $Si_{1-x}Ge_x$ ($0<x\leq1$) film on the silicon film, wherein the silicon film is formed by splitting a silicon substrate after the quartz substrate is bonded to the silicon substrate, and the strained $Si_{1-x}Ge_x$ ($0<x\leq1$) film is epitaxially grown on the silicon film.

As described above, the bonded substrate according to the one of preferred embodiments of the present invention comprises the quartz substrate, the split silicon film on the quartz substrate, and the strained $Si_{1-x}Ge_x$ ($0<x\leq1$) film epitaxially grown on the silicon film. Here, the biaxial strain in the $Si_{1-x}Ge_x$ ($0<x\leq1$) film formed on the silicon substrate is relaxed at the temperature during the epitaxial growth. The $Si_{1-x}Ge_x$ ($0<x\leq1$) film tries to contract when cooled after the epitaxial growth; however, the quartz substrate having a low thermal expansion coefficient hardly contracts. The $Si_{1-x}Ge_x$ ($0<x\leq1$) film therefore is not allowed to contract in such a way that the $Si_{1-x}Ge_x$ ($0<x\leq1$) film follows the manner of the quartz substrate. In this way, a large biaxial strain is introduced in the $Si_{1-x}Ge_x$ ($0<x\leq1$) film. Hence, the bonded substrate comprising such a film can be formed.

Furthermore, the strained $Si_{1-x}Ge_x$ ($0<x\leq1$) film obtained by the above-described production method can be transferred after the bonded substrate comprising the strained $Si_{1-x}Ge_x$ ($0<x\leq1$) film is bonded to a newly provided silicon substrate or a newly provided silicon substrate with an oxide film thereon. Specifically, the $Si_{1-x}Ge_x$ ($0<x\leq1$) film can be transferred to a silicon substrate or a silicon substrate with an oxide film thereon by, for example, implanting ions of $H^+$ or $H_2^+$ into the $Si_{1-x}Ge_x$ ($0<x\leq1$) film, performing a surface activation treatment on one or both of the substrates, then optionally performing a heat treatment thereon at a low temperature of 350° C. or lower, and applying a mechanical impact to the ion-implanted interface. The dose amount of $H^+$ is preferably in a range of $3.0 \times 10^{16}$ to $1.0 \times 10^{17}$ atoms/cm². The dose amount of $H_2^+$ is preferably in a range of $1.5 \times 10^{16}$ to $5.0 \times 10^{16}$ atoms/cm².

Hereinafter, the method for producing a bonded substrate of the present invention will be described in more specifically on the basis of Example.

EXAMPLE

Thirty bonded substrates were produced as shown in FIG. 1 according to the method for producing a bonded substrate as follows.

First, a silicon substrate as a donor wafer and a quartz substrate as a handle wafer were provided. Next, hydrogen ions were implanted into one surface of the donor wafer to form a hydrogen-ion-implanted layer therein. As the ion implantation conditions, the implantation energy was 35 keV, the implantation dose was $9 \times 10^{16}$/cm², and the implantation depth was 0.3 μm.

Next, the ion-implanted silicon substrate was placed in a plasma treatment apparatus. After nitrogen is introduced as a plasma gas therein, a high-frequency plasma treatment was performed for 10 seconds on the ion-implanted surface by applying a high frequency of 13.56 MHz between parallel plate electrodes each having a diameter of 300 mm under a reduced pressure condition of 2 Torr(270 Pa) and a high-frequency power condition of 50 W. In this manner, a surface activation treatment was performed on the ion-implanted surface of the silicon substrate.

Meanwhile, the quartz substrate was placed in a plasma treatment apparatus. After nitrogen gas was introduced as a plasma gas in a narrow space between electrodes, a high frequency was applied between the electrodes to generate plasma. Thereby, a high-frequency plasma treatment was performed for 10 seconds. In this manner, a surface activation treatment was also performed on the bonding surface of the quartz substrate which was to be bonded in the subsequent bonding step.

The silicon substrate and the quartz substrate which had been subjected to the surface activation treatments as described above were closely adhered together at room temperature while using the surfaces thus subjected to the surface activation treatments as the bonding surfaces. Then, the back surfaces of the respective substrates were strongly pushed or pressed against each other in a thickness direction.

Next, in order to increase the bonding strength, a substrate resulting from the bonding between the silicon substrate and the quartz substrate was subjected to a heat treatment at 300° C. for 30 minutes.

Next, an external impact was applied to the ion-implanted layer of the silicon substrate. The silicon substrate was consecutively divided along the ion-implanted layer, and thereby a silicon film was formed.

Subsequently, a polishing treatment was performed as a surface treatment on a split surface of the silicon substrate with a polishing margin of 0.05 μm.

Thereafter, by using the LPCVD method, a $Si_{0.09}Ge_{0.10}$ layer (X=0.1) of approximately 100 nm was grown on the split surface of the silicon substrate which the split surface had been subjected to the surface treatment. As this epitaxial growth conditions, a mixed gas of $SiH_4$ or $SiH_2Cl_2$ and $GeH_4$ was used as a raw-material gas, and $H_2$ was used as a carrier gas. The growth temperature was 600° C., and the pressure was 10 Torr.

In this way, a bonded substrate comprising the silicon film and the strained $Si_{0.09}Ge_{0.10}$ film on the quartz substrate was produced. The amount of strain in the strained $Si_{0.09}Ge_{0.10}$ film of each of 30 bonded substrates produced in this way was measured. An average strain amount was 1.05%. The strain amounts were measured by using Raman spectroscopy under the following conditions.

Analysis method: backscatter Raman spectrum measurement
Apparatus: Super Labram produced by Dilor Co.
Slit width: 100 □m
Detector: multi channel CCD
Light source: He—Ne laser (632.8 nm)
Optical system: microscope (objective 100 times magnification)
Laser beam diameter: approximately 1 □m□
Light source output: 1.0 mW
Integration time: 60 seconds
Number of integration: 1
Sample conditions: room temperature, in air Note that the present invention is not limited to the above-described embodiments. The embodiments are exemplary, and any means having substantially the same configuration as and a similar operation and effect to those of a technological idea described in claims of the present invention are included in the scope of the present invention.

The invention claimed is:

1. A method for producing a bonded substrate, comprising at least the steps of:
   providing a donor wafer formed of one of a silicon substrate and a silicon substrate having a silicon oxide film directly formed on the silicon substrate and a handle wafer having a thermal expansion coefficient lower than the donor wafer,
   implanting ions of any one or both of hydrogen and a noble gas into the donor wafer to form an ion-implanted layer,
   performing a surface activation treatment on at least one of bonding surfaces of the donor wafer and the handle wafer,
   bonding the donor wafer to the handle wafer,
   thinning the donor wafer to form a silicon film containing only silicon by splitting the donor wafer through application of a mechanical impact to the ion-implanted layer of the donor wafer,
   performing a surface treatment on a split surface of the silicon film,
   epitaxially growing at an epitaxial growth temperature of 500° C. to 900° C. a $Si_{1-x}Ge_x$(wherein x is a number satisfying 0<x≤1) film on the split surface to form a strained $Si_{1-x}Ge_x$(0<x≤1) film directly on the silicon film of the bonded wafers, and
   wherein the bonded wafers are subjected to a heat treatment in a temperature range of 100° C. to 350° C. after said step of bonding the donor wafer to the handle wafer, but before said step of thinning the donor wafer.

2. The method for producing a bonded substrate according to claim 1, wherein said surface treatment performed is at least one of a polishing treatment, a heat treatment and an etching treatment.

3. The method for producing a bonded substrate according to claim 1, wherein said handle wafer is of quartz.

4. The method for producing a bonded substrate according to claim 1, wherein said handle wafer is of a material having a thermal expansion coefficient of $1.3 \times 10^{-6}$ (/K) or lower.

5. The method for producing a bonded substrate according to claim 1, wherein the value of x of said strained $Si_{1-x}Ge_x$ (0<x≤1) film is 0.1 or greater.

6. The method for producing a bonded substrate according to claim 1, wherein said epitaxially grown $Si_{1-x}Ge_x$ (0<x≤1) film is transferred to and bonded to a newly provided silicon substrate or the newly provided silicon substrate with an oxide film thereon.

7. The method for producing a bonded substrate according to claim 1, wherein said step of epitaxially growing a $Si_{1-x}Ge_x$ film is performed so as to cause said silicon film to have a lattice constant smaller than $Si_{1-x}Ge_x$ (0<x≤1).

8. The method for producing a bonded substrate according to claim 7, wherein said step of epitaxially growing a $Si_{1-x}Ge_x$ film is performed so as to cause said silicon film to have an average strain amount of about 1.05%.

9. A method for producing a bonded substrate, comprising at least the steps of:
provide a donor wafer formed of one of a silicon substrate and a silicon substrate having a silicon oxide film directly formed on the silicon substrate and a handle wafer having a thermal expansion coefficient lower than the donor wafer,
implanting ions of any one or both of hydrogen and a noble gas into the donor wafer to form an ion-implanted layer,
performing a surface activation treatment on at least one of bonding surfaces of the donor wafer and the handle wafer,
bonding the donor wafer to the handle wafer,
thinning the donor wafer to form a silicon film consisting essentially of silicon by splitting the donor wafer through application of a mechanical impact to the ion-implanted layer of the donor wafer,
performing a surface treatment on a split surface of the silicon film, epitaxially growing at an epitaxial growth temperature of 500° C. to 900° C. a $Si_{1-x}Ge_x$ (wherein x is a number satisfying 0<x≤1) film on the split surface to form a strained $Si_{1-x}Ge_x$ (0<x≤1) film directly on the silicon film of the bonded wafers, and
wherein the bonded wafers are subjected to a heat treatment in a temperature range of 100° C. to 350° C. after said step of bonding the donor wafer to the handle wafer, but before said step of thinning the donor wafer.

10. The method for producing a bonded substrate according to claim 1, wherein said ions are implanted into a surface of said donor wafer opposite said bonding surface.

* * * * *